United States Patent
Ryu et al.

(10) Patent No.: US 11,089,677 B2
(45) Date of Patent: Aug. 10, 2021

(54) FLEXIBLE PRINTED CIRCUIT BOARD AND MOBILE TERMINAL COMPRISING SAME

(71) Applicant: LG ELECTRONICS INC., Seoul (KR)

(72) Inventors: Seungwoo Ryu, Seoul (KR); Joohee Lee, Seoul (KR); Junyoung Jung, Seoul (KR); Sangjo Park, Seoul (KR); Youngjik Lee, Seoul (KR); Jaewon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/979,448

(22) PCT Filed: May 17, 2018

(86) PCT No.: PCT/KR2018/005667
§ 371 (c)(1),
(2) Date: Sep. 9, 2020

(87) PCT Pub. No.: WO2019/198870
PCT Pub. Date: Oct. 17, 2019

(65) Prior Publication Data
US 2021/0007213 A1 Jan. 7, 2021

Related U.S. Application Data

(60) Provisional application No. 62/655,209, filed on Apr. 9, 2018.

(51) Int. Cl.
*H05K 1/02* (2006.01)
*H05K 1/11* (2006.01)

(52) U.S. Cl.
CPC ............. *H05K 1/028* (2013.01); *H05K 1/115* (2013.01); *H05K 2201/0715* (2013.01); *H05K 2201/10098* (2013.01)

(58) Field of Classification Search
CPC .................. H05K 1/028; H05K 1/115; H05K 2201/0715; H05K 2201/10098; H05K 1/147; H01Q 1/243; H01Q 1/38
(Continued)

(56) References Cited

U.S. PATENT DOCUMENTS 10,141,625 B1 * 11/2018 Ryu ..................... H05K 7/2039
2013/0050029 A1    2/2013  Xu et al.
(Continued)

FOREIGN PATENT DOCUMENTS

KR         20-0432681 Y1    12/2006
KR       10-2010-0061499 A   6/2010
(Continued)

*Primary Examiner* — Sherman Ng
(74) *Attorney, Agent, or Firm* — Birch, Stewart, Kolasch & Birch LLP

(57) ABSTRACT

A mobile terminal includes a case; a circuit board disposed inside the case; a flexible printed circuit board electrically connected to the circuit board, and having insulating layers and conductive layers stacked in an alternating manner; a first antenna disposed on a first region of the flexible printed circuit board and facing an end surface of the case and configured to transmit radio signals in a direction toward the end surface of the case; a plurality of microstrip lines disposed on a bent second region of the flexible printed circuit board at a side portion of the first region; and a copper clad laminate stacked second antenna disposed on a third region of the flexible printed circuit board positioned on another side portion of the second region and configured to transmit radio signals in a direction toward a side surface of the case.

17 Claims, 6 Drawing Sheets

(58) Field of Classification Search
USPC .......................................................... 361/749
See application file for complete search history.

(56) References Cited

U.S. PATENT DOCUMENTS

| | | | | |
|---|---|---|---|---|
| 2015/0338879 | A1* | 11/2015 | Hiramoto | G06F 1/163 |
| | | | | 361/679.03 |
| 2017/0229784 | A1* | 8/2017 | Kitamura | H01Q 21/0025 |
| 2018/0035532 | A1* | 2/2018 | Chen | H05K 1/147 |
| 2018/0062263 | A1* | 3/2018 | Ueda | H01Q 21/29 |
| 2018/0131087 | A1* | 5/2018 | Kim | H01Q 1/2283 |

FOREIGN PATENT DOCUMENTS

| | | |
|---|---|---|
| KR | 10-2010-0079336 A | 7/2010 |
| KR | 10-2016-0135440 A | 11/2016 |

\* cited by examiner

FLEXIBLE PRINTED CIRCUIT BOARD AND MOBILE TERMINAL COMPRISING SAME

CROSS-REFERENCE TO RELATED APPLICATIONS

This Application is a National Phase of PCT International Application No. PCT/KR2018/005667 filed on May 17, 2018, which claims the priority benefit under 35 U.S.C. § 119(e) to U.S. Provisional Application No. 62/655,209 filed on Apr. 9, 2018, all of which are hereby expressly incorporated by reference into the present application.

BACKGROUND OF THE INVENTION

Field of the Invention

The present disclosure relates to a flexible printed circuit board and a mobile terminal having the same.

Discussion of the Related Art

A mobile terminal is an electronic device that may be used on the go, and may be classified into handheld types and vehicle mount types according to whether or not a user can directly carry. Mobile terminals have various functions according to development of technologies. For example, mobile terminals can be allowed to capture still images or moving images, play music or video files, play games, receive broadcast and the like, so as to be implemented as an integrated multimedia player. Efforts are ongoing to support and increase the functionality of mobile terminals. Such efforts include software and hardware improvements, as well as changes and improvements in the structural components.

In order for mobile terminals to provide a broadband service, the mobile terminals need to perform wireless communication in a higher frequency band. In recent years, standardization of fifth generation (5G) communication services using a mmWave band is underway, and a 5G antenna structure is newly being designed.

And recently, more various electronic elements (dual cameras, finger scan sensors, etc.) have been added to mobile terminals, and research for realizing such mobile terminals slimmer is being conducted. Accordingly, a region in which the electronic elements can be mounted on a circuit board of the mobile terminal is gradually being insufficient.

5G antennas have limitations in size reduction because 5G antennas include array elements for beamforming. In addition, antennas and integrated circuits are typically configured as a 1-Package (AIP: Antenna in Package) in order to reduce signal loss between the 5G antenna and the integrated circuit, there is a limitation in minimizing the AIP due to the size of the antenna. Further, more AIPs are needed to increase a coverage of the 5G antenna, but there is a design constraint to increase the region of the circuit board to be allocated for mmWave due to a limitation of the size of the circuit board.

Therefore, it may be considered to use a flexible printed circuit board on which the 5G antenna is mounted to expand the coverage of the 5G antenna while fully utilizing an internal space of the mobile terminal. However, when the flexible printed circuit board is used, it is required to fully utilize the internal space of the mobile terminal by reducing the thickness. And when the flexible printed circuit board is positioned to bend inside the mobile terminal, a structure of a via cannot be maintained so that parasitic resonance occurs.

SUMMARY OF THE INVENTION

One aspect of the present disclosure is to provide a structure that can freely change an installation position of a 5G antenna by utilizing a space inside a mobile terminal and expand a coverage of the 5G antenna.

Another aspect of the present disclosure is to provide a structure that can reduce a region occupied by a circuit board by reducing a thickness of a flexible printed circuit board mounted with a 5G antenna.

Another aspect of the present disclosure is to provide a structure capable of preventing occurrence of parasitic resonance due to bending of a flexible printed circuit board.

According to the aspects of the present disclosure, there is provided a mobile terminal including a case forming at least part of appearance of a terminal body, a circuit board disposed inside the case, and a flexible printed circuit board electrically connected to the circuit board, and formed by alternately stacking insulating layers and conductive layers, wherein the flexible printed circuit board includes a first region in which a first antenna is mounted, a second region bent at a side portion of the first region and having microstrip lines on any one of the conductive layers to transmit signals, and a third region positioned on another side portion of the second region, and having a second antenna formed of a copper clad laminate stacked thereon to emit a radio signal in a direction crossing the first antenna.

According to one embodiment disclosed herein, the second antenna may configure an array antenna by forming an antenna pattern set on the copper clad laminate stacked on an upper surface of the third region.

According to another embodiment of the present disclosure, vias connecting the conductive layers for signal transmission may be provided in a plurality of locations in the first region and the second region.

According to another embodiment of the present disclosure, the second region may be bent in a shape corresponding to a side surface portion of the case, and the third region may be positioned to face the side surface portion of the case.

According to another embodiment of the present disclosure, other conductive layers constituting signal layers may be disposed on the conductive layers constituting ground layers.

According to another embodiment of the present disclosure, a connector may be installed at one side of the first region to be connected to the circuit board.

In this case, a first connector may be mounted on a lower surface of the first region, and a second connector fitted to and coupled to the first connector may be mounted on the circuit board.

At this time, a ground layer may be formed on a lower end surface of the flexible printed circuit board, and a shielding sheet may be coupled to a lower surface of the ground layer to cover the ground layer.

In addition, the ground layer may be formed at a lower end portion of the flexible printed circuit board, and a cover layer may be formed on a lower surface of the ground layer to prevent oxidation. In this case, the cover layer may be configured to cover a lower end portion of the second region.

According to another embodiment of the present disclosure, a first antenna configured to transmit and receive radio signals may be mounted in the first region, and a wireless communication module configured to process the radio signals may be mounted on any one side of the first region.

According to the aspects of the present disclosure, a flexible printed circuit board may be configured as: a first region where the flexible printed circuit board is located inside the mobile terminal, insulating layers and conductive layers are alternately stacked, and the flexible printed circuit board extends in one direction and a wireless communication module is mounted on one side thereof; a second region formed to be bent at a side portion of the first region, and configured to transmit signals by including microstrip lines on the conductive layer; and a third region positioned on an opposite side of the first region with respect to the second region, and having a second antenna formed of a copper clad laminate stacked to emit radio signals in a direction crossing the first region.

In this case, the second antenna may configure an array antenna by forming an antenna pattern set on the copper clad laminate stacked on the upper surface of the third region.

In addition, vias connecting the conductive layers for signal transmission may be provided in a plurality of locations in the first and third regions.

According to another embodiment of the present disclosure, other conductive layers constituting signal layers may be disposed on the conductive layers constituting ground layers.

At this time, a ground layer may be formed on a lower end surface of the flexible printed circuit board, and a shielding sheet may be coupled to the lower surface of the ground layer to cover the ground layer.

In addition, a ground layer may be formed at a lower end portion of the flexible printed circuit board, and a cover layer may be formed on the lower surface of the ground layer to prevent oxidation.

According to one embodiment of the present disclosure, the first antenna configured to transmit and receive radio signals may be mounted in the first region, and the wireless communication module configured to process the radio signals may be mounted on any one side of the first region.

Advantageous Effects

The effects of the present disclosure to be obtained by the above-described solutions are as follows.

A 5G antenna is mounted on a flexible printed circuit board that is electrically connected to a circuit board, to reduce a region occupied by the antenna on the circuit board, thereby obtaining design advantages.

In addition, thickness of the flexible printed circuit board can be reduced by further stacking copper layers on one region of the flexible printed circuit board, and antenna signals can be emitted in a direction toward a side surface portion of the case, thereby securing a coverage of the expanded 5G antenna.

In addition, a structure of a via is broken by applying a microstrip line structure to a region where the flexible printed circuit board is bent, thereby reducing parasitic resonance generated at mmWave frequency.

Further, the structure of the via is broken in a bending region by attaching a shielding sheet to a lower surface of the flexible printed circuit board, so that the parasitic resonance generated at mmWave frequency can be reduced.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Figure 1:
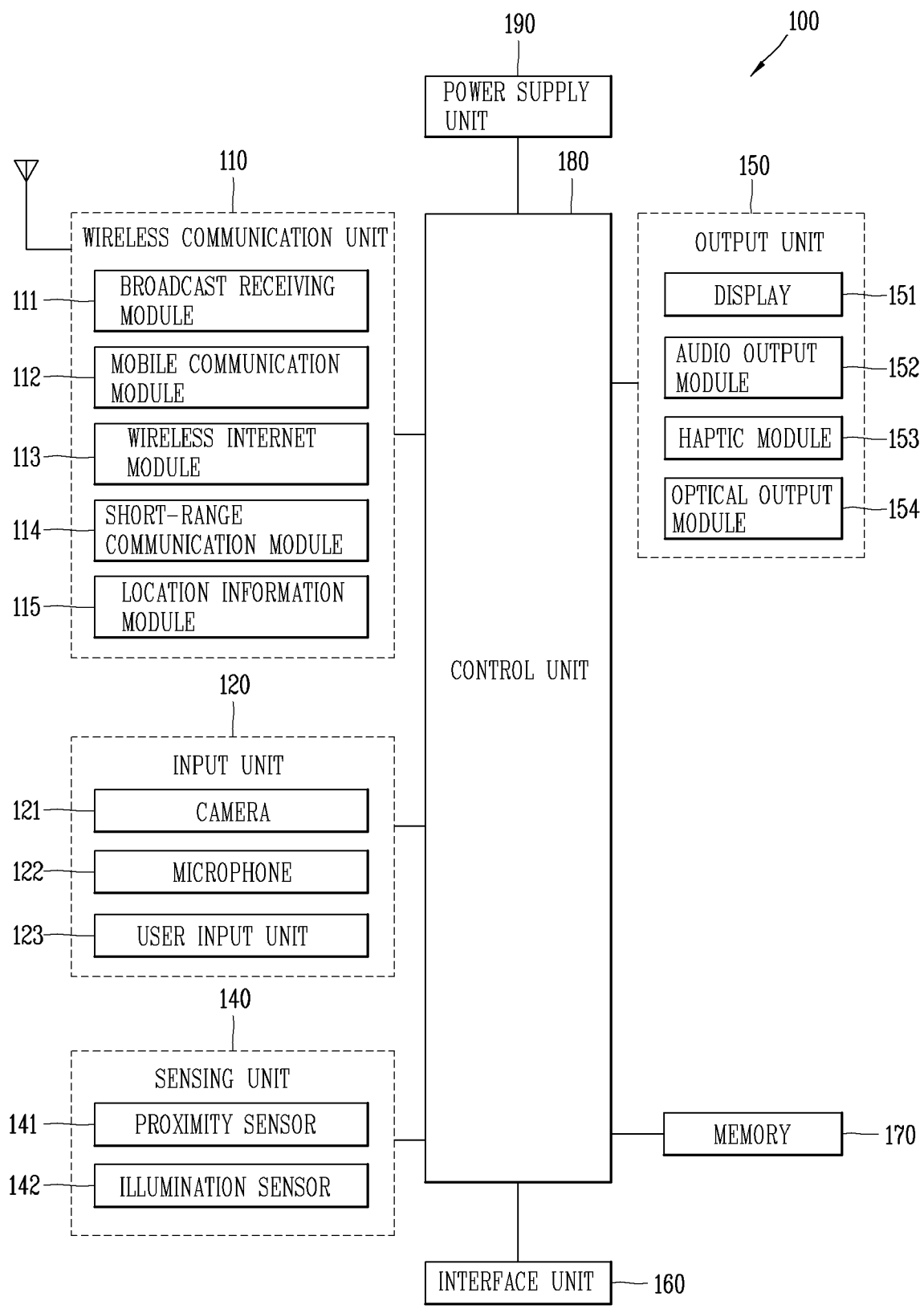
FIG. 1 is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated.

In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art.

The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another. It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra-books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 2:
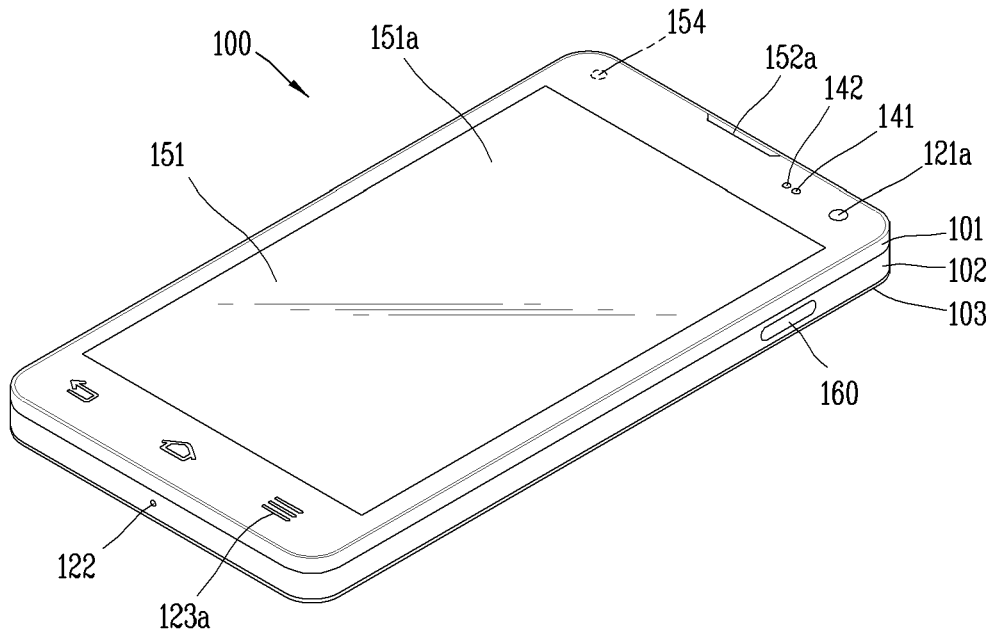
FIGS. 2 and 3 are conceptual views of a mobile terminal according to one embodiment of the present disclosure, viewed from different directions.
Figure 3:
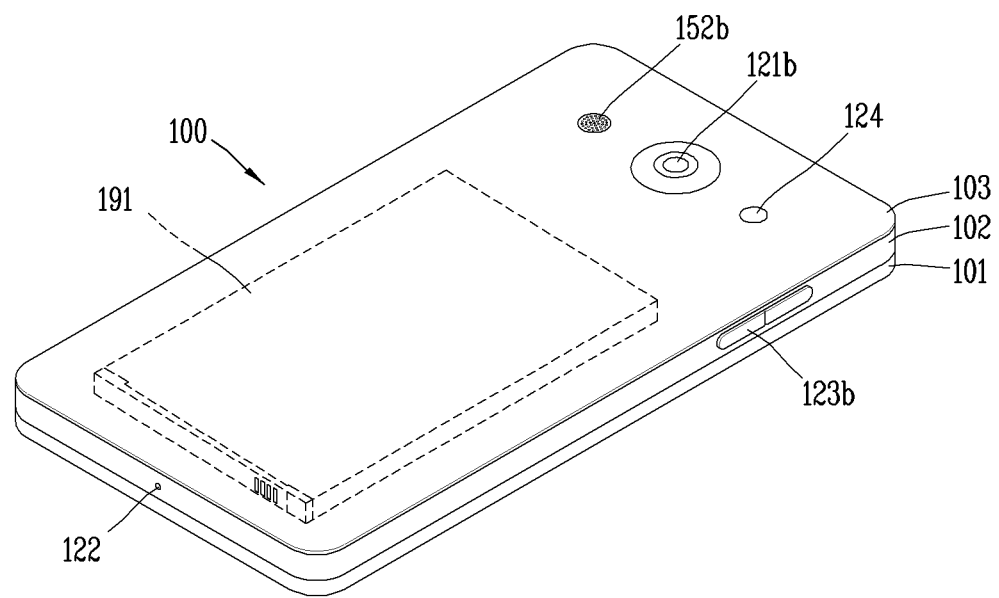

Referring to FIGS. 1 to 3, FIG. 1 is a block diagram of a mobile terminal in accordance with one exemplary embodiment of the present disclosure, and FIGS. 2 and 3 are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a control unit (controller) 180, and a power supplier 190. It is understood that implementing all of the illustrated components is not a requirement. Greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communicator 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, a red, green, and blue (RGB) sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from two or more sensors of the sensing unit 140, and combinations thereof.

The output unit 150 may typically be configured to output various types of information, such as audio, video, tactile output, and the like. The output unit 150 may include at least one of a display 151, an audio output module 152, a haptic module 153, and an optical output module 154. The display 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless headset ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is implemented to store data to support various functions or features of the mobile terminal 100. For instance, the memory 170 may be configured to store application programs or applications executed in the mobile terminal 100, data or instructions for operations of the mobile terminal 100, and the like. At least one of these application programs may be downloaded from an external server via wireless communication. Other application programs may be installed within the mobile terminal 100 at time of manufacturing or shipping, which is the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The controller 180 functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1, to execute an application program that have been stored in the memory 170. In addition, the controller 180 may control at least two of those components included in the mobile terminal 100 to activate the application program.

The power supplier 190 may be configured to receive external power or internal power in order to supply appropriate power required for operating elements and components included in the mobile terminal 100, under the control by the controller 180. The power supplier 190 may include a battery, and the battery may be configured as an embedded battery or a detachable battery.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Hereinafter, description will be given in more detail of the aforementioned components with reference to FIG. 1, prior to describing various embodiments implemented through the mobile terminal 100.

First, regarding the wireless communication unit 110, the broadcast receiving unit 111 is configured to receive a broadcast signal and/or broadcast associated information from an external broadcast managing server via a broadcast channel. The broadcast channel may include a satellite channel, a terrestrial channel, or both. Two or more broadcast receivers may be provided to the mobile terminal 100 to facilitate simultaneous reception of two or more broadcast channels, or to support switching among broadcast channels.

The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal in a form that a TV or radio broadcast signal is combined with a data broadcast signal.

The broadcast signal may be encrypted by at least one of technical standards (or broadcasting methods, e.g., ISO, IEC, DVB, ATSC, etc.) for transmitting and receiving a digital broadcast signal. The broadcast receiver 111 may receive the digital broadcast signal using a method suitable for a technical standard selected from those technical standards.

Examples of the broadcast associated information may include information associated with a broadcast channel, a broadcast program, a broadcast service provider, and the like. The broadcast associated information may be provided via a mobile communication network. In this case, the broadcast associated information may be received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like. The broadcast signal and/or the broadcast related information received through the broadcast receiving module 111 may be stored in the memory 170.

The mobile communication module 112 can transmit and/or receive radio signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). The radio signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive radio signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area network.

Here, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal. As an example, the location information module 115 includes a Global Position System (GPS) module, a Wi-Fi module, or both. For example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a radio signal to or from the Wi-Fi module. If desired, the location information module 115 may alternatively or additionally function with any of the other modules of the wireless communicator 110 to obtain data related to the position of the mobile terminal. The location information module 115 is a module used for acquiring the position (or the current position) and may not be limited to a module for directly calculating or acquiring the position of the mobile terminal.

Examples of such inputs include audio, image, video, data, and user input. Image and video input are often obtained using one or more cameras 121. Such cameras 121 may process image frames of still pictures or video obtained by image sensors in a video or image capture mode. The processed image frames can be displayed on the display 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data can be processed in various manners according to a function being executed in the mobile terminal 100. The microphone 122 may include assorted noise removing algorithms to remove unwanted noise generated in the course of receiving the external audio signal.

The user input unit 123 is a component that receives an input of information from a user. Such user input may enable the controller 180 to control operation of the mobile terminal 100 in correspondence with the received information. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like, and generate a corresponding sensing signal. The controller 180 generally cooperates with the sending unit 140 to control operations of the mobile terminal 100 or execute data processing, a function or an operation associated with an application program installed in the mobile terminal based on the sensing signal. The sensing unit 140 may be implemented using any of a variety of sensors, some of which will now be described in more detail.

The proximity sensor 141 refers to a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared ray proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data (or information) according to whether a touch with respect to a point on the touch screen is either a proximity touch or a contact touch.

A touch sensor can sense a touch (or a touch input) applied to the touch screen, such as display 151, using any of a variety of touch methods. Examples of such touch methods include a resistive type, a capacitive type, an infrared type, and a magnetic field type, among others. As one example, the touch sensor may be configured to convert changes of pressure applied to a specific part of the display 151, or convert capacitance occurring at a specific part of the display 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display 151 has been touched. Here, the touch controller may be a component separate from the controller 180, the controller 180, and combinations thereof.

Meanwhile, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, includes at least one a camera sensor (CCD, CMOS etc.), a photo sensor (or image sensors), and a laser sensor. Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display 151 is generally configured to output information processed in the mobile terminal 100. For example, the display 151 may display execution screen information of an application program executing at the mobile terminal 100 or user interface (UI) and graphic user interface (GUI) information in response to the execution screen information. Also, the display 151 may be implemented as a stereoscopic display for displaying stereoscopic images.

A typical stereoscopic display may employ a stereoscopic display scheme such as a stereoscopic scheme (a glass scheme), an auto-stereoscopic scheme (glassless scheme), a projection scheme (holographic scheme), or the like. In general, a 3D stereoscopic image is comprised of a left image (a left eye image) and a right image (a right eye image). According to how left and right images are combined into a 3D stereoscopic image, the 3D stereoscopic imaging method is divided into a top-down method in which left and right images are disposed up and down in a frame, an L-to-R (left-to-right, side by side) method in which left and right images are disposed left and right in a frame, a checker board method in which fragments of left and right images are disposed in a tile form, an interlaced method in which left and right images are alternately disposed by columns and rows, and a time sequential (or frame by frame) method in which left and right images are alternately displayed by time.

Also, as for a 3D thumbnail image, a left image thumbnail and a right image thumbnail are generated from a left image and a right image of the original image frame, respectively, and then combined to generate a single 3D thumbnail image. In general, thumbnail refers to a reduced image or a reduced still image. The thusly generated left image thumbnail and the right image thumbnail are displayed with a horizontal distance difference therebetween by a depth corresponding to the disparity between the left image and the right image on the screen, providing a stereoscopic space sense.

A left image and a right image required for implementing a 3D stereoscopic image may be displayed on the stereoscopic display by a stereoscopic processing unit. The stereoscopic processing unit may receive the 3D image (an image of a reference time point and an image of an extension time point), and extract the left image and the right image, or may receive 2D images and change them into a left image and a right image.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

The haptic module 153 generates various tactile effects that a user feels, perceives, or otherwise experiences. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 may output a signal for indicating an event generation using light of a light source of the mobile terminal 100. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control operations relating to application programs and the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supplier 190 receives external power or provides internal power and supply the appropriate power required for operating respective elements and components included in the wearable device 100 under the control of the controller 180. The power supplier 190 may include a battery, which is typically rechargeable or be detachably coupled to the terminal body for charging.

The power supplier 190 may include a connection port. The connection port may be configured as one example of the interface unit 160 to which an external charger for supplying power to recharge the battery is electrically connected. As another example, the power supplier 190 may be configured to recharge the battery in a wireless manner without use of the connection port. In this example, the power supplier 190 can receive power, transferred from an external wireless power transmitter, using at least one of an inductive coupling method which is based on magnetic induction or a magnetic resonance coupling method which is based on electromagnetic resonance. Various embodiments described herein may be implemented in a computer-readable medium, a machine-readable medium, or similar medium using, for example, software, hardware, or any combination thereof.

Referring to FIGS. 2 and 3, the mobile terminal 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well. Here, considering the mobile terminal 100 as at least one assembly, the terminal body may be understood as a conception referring to the assembly.

The mobile terminal 100 will generally include a case (for example, frame, housing, cover, and the like) forming an appearance of the terminal. In this embodiment, the case is formed using a front case 101 and a rear case 102. Various electronic components are interposed into a space formed between the front case 101 and the rear case 102. At least one middle case (not illustrated) may be additionally positioned between the front case 101 and the rear case 102.

The display 151 is shown located on a front side of the terminal body to output information. As illustrated, a window 151a of the display 151 may be mounted in the front case 101 to form a front surface of the terminal body together with the front case 101.

In some embodiments, electronic components may also be mounted in the rear case 102. Examples of such electronic components include a detachable battery 191, an identification module, a memory card, and the like. In this case, a rear cover 103 is shown covering the electronic components, and this cover may be detachably coupled to the rear case 102. Therefore, when the rear cover 103 is detached from the rear case 102, the electronic components mounted in the rear case 102 are exposed to the outside.

As illustrated, when the rear cover 103 is coupled to the rear case 102, a side surface of the rear case 102 may partially be exposed. In some cases, upon the coupling, the rear case 102 may also be completely shielded by the rear cover 103. Meanwhile, the rear cover 103 may include an opening for externally exposing a camera 121b or the audio output module 152b.

The cases 101, 102, and 103 may be formed by injection-molding synthetic resin or may be formed of a metal, for example, stainless steel (STS), aluminum (Al), titanium (Ti), or the like. As an alternative to the example in which the plurality of cases forms an inner space for accommodating components, the mobile terminal 100 may be configured such that one case forms the inner space. In this case, a mobile terminal 100 having a uni-body is formed in such a manner that synthetic resin or metal extends from a side surface to a rear surface.

Meanwhile, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include a display 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 2 and 3, description will be given of the exemplary mobile terminal 100 in which the front surface of the terminal body is shown having the display 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may be located on another surface of the terminal body, and the second audio output module 152b may be located on the side surface of the terminal body other than the rear surface of the terminal body.

The display 151 is generally configured to output information processed in the mobile terminal 100. For example, the display 151 may display execution screen information of an application program executing at the mobile terminal 100 or user interface (UI) and graphic user interface (GUI) information in response to the execution screen information.

The display 151 may include at least one of a liquid crystal display (LCD), a thin film transistor-LCD (TFT LCD), an organic light-emitting diode (OLED), a flexible display, a three-dimensional (3D) display and an e-ink display. The display 151 may be implemented using two display devices, according to the configuration type thereof. For instance, a plurality of the displays 151 may be arranged on one side, either spaced apart from each other, or these devices may be integrated, or these devices may be arranged on different surfaces.

The display 151 may include a touch sensor that senses a touch with respect to the display 151 so as to receive a control command in a touch manner. Accordingly, when a touch is applied to the display 151, the touch sensor may sense the touch, and a controller 180 may generate a control command corresponding to the touch. Contents input in the touch manner may be characters, numbers, instructions in various modes, or a menu item that can be specified.

On the other hand, the touch sensor may be configured in a form of a film having a touch pattern and disposed between a window 151a and a display (not illustrated) on a rear surface of the window, or may be a metal wire directly patterned on the rear surface of the window. Alternatively, the touch sensor may be formed integrally with the display. For example, the touch sensor may be disposed on a substrate of the display, or may be provided inside the display.

In this way, the display 151 may form a touch screen together with the touch sensor, and in this case, the touch screen may function as the user input unit (123, see FIG. 1). In some cases, the touch screen may replace at least some of functions of a first manipulation unit 123a.

The first audio output module 152a may be implemented as a receiver for transmitting a call sound to a user's ear and the second audio output module 152b may be implemented as a loud speaker for outputting various alarm sounds or multimedia reproduction request sounds.

The window 151a of the display 151 may include a sound hole for emitting sounds generated from the first audio output module 152a. However, the present disclosure is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121a may process image frames such as still or moving images obtained by the image sensor in a capture mode or a video call mode. The processed image frames can then be displayed on the display 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display 151, or the like. The rear input unit may be implemented into a form allowing a touch input, a push input or a combination thereof.

The rear input unit may be disposed to overlap the display 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least some of functions of the first manipulation unit 123a located on the front surface of the terminal body. Accordingly, when the first manipulation unit 123a is not disposed on the front surface of the terminal body, the display 151 may be implemented to have a larger screen.

On the other hand, the mobile terminal 100 may include a finger scan sensor which scans a user's fingerprint. The controller 180 may use fingerprint information sensed by the finger scan sensor as an authentication means. The finger scan sensor may be installed in the display 151 or the user input unit 123.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may be arranged in a matrix form. The cameras may be referred to as an 'array camera.' When the second camera 121b is implemented as the array camera, images may be captured in various manners using the plurality of lenses and images with better qualities may be obtained. The flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement stereophonic sound functions in conjunction with the first audio output module 152a, and may be also used for implementing a speaker phone mode for call communication.

At least one antenna for wireless communication may be disposed on the terminal body. The antenna may be embedded in the terminal body or formed in the case. For example, an antenna which configures a part of the broadcast receiver 111 (see FIG. 1A) may be retractable into the terminal body. Alternatively, an antenna may be formed in a form of film to be attached onto an inner surface of the rear cover 103 or a case including a conductive material may serve as an antenna.

The terminal body is provided with a power supplier 190 (see FIG. 1A) for supplying power to the mobile terminal 100. The power supplier 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 103 may be detachably coupled to the rear case 102.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display 151 to extend the function of the mobile terminal 100. Another example of the accessory may be a touch pen for assisting or extending a touch input onto a touch screen.

As described above, the mobile terminal may be provided with at least one antenna for wireless communication, and may include an antenna for implementing fifth generation wireless communication. In a fourth generation wireless communication, a low band frequency of 2 GHz or lower is mainly used, while in a fifth generation wireless communication, a high band frequency of about 28 GHz or 39 GHz is mainly used.

A communication using a low band frequency has a wide coverage with a long wavelength, but has a slow transmission rate due to a relatively narrow bandwidth. On the other hand, a communication using a high band frequency has a relatively wide bandwidth and thus has a high transmission speed, but has a narrow coverage due to a short wavelength. This coverage constraint can be solved when using array elements having propagation characteristics with strong linearity. Accordingly, the fifth generation wireless communication can provide various communication services to users with increased capacity.

Figure 4:
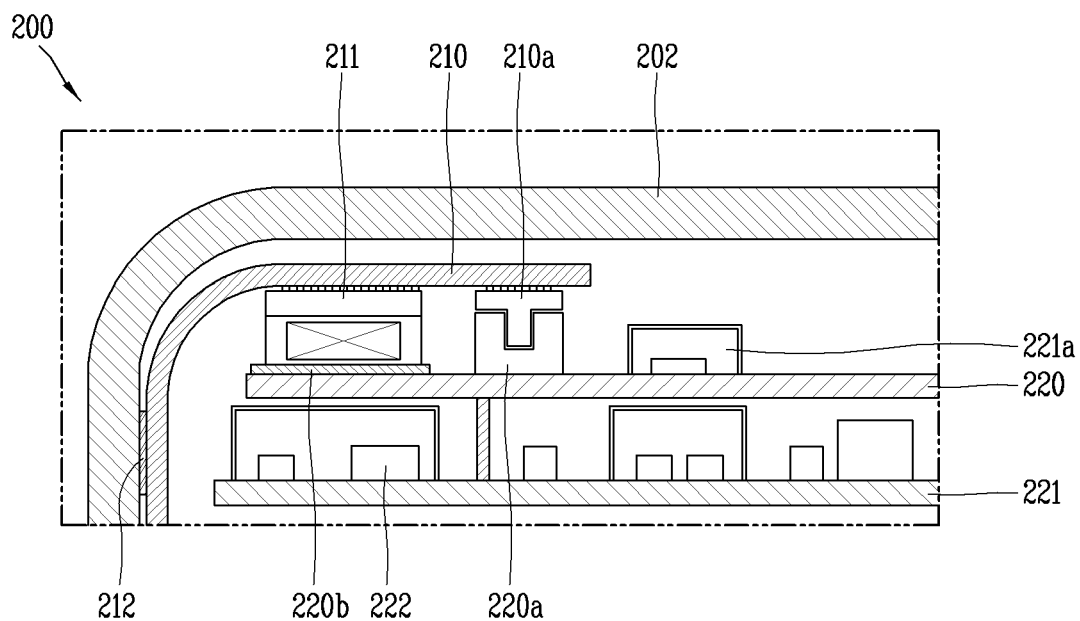
FIG. 4 is a conceptual view illustrating an internal structure of a mobile terminal in which a flexible printed circuit board is installed.

FIG. 4 is a conceptual diagram illustrating an internal structure of a mobile terminal 200 in which a flexible printed circuit board 210 is installed. The mobile terminal 200 according to the present disclosure has a structure including the flexible printed circuit board 210 in order to utilize the internal space of the mobile terminal 200 while securing a region in which electronic elements 222 can be mounted on a circuit board 220, 221.

Since antenna elements for 5G wireless communication are arranged in an array type, the size of the antenna becomes large while forming the array even if the size of each element 212a is small. Therefore, an area occupied by a 1-Package (AIP: Antenna in Package) on the circuit board 220 is also increased by the size of the antenna. In order to solve such a problem, the mobile terminal 200 according to the present disclosure includes the flexible printed circuit board 210 disposed inside the mobile terminal 200 by using flexible characteristics thereof. By doing so, space constraints can be overcome.

That is, an antenna having array elements 212a may be mounted on the flexible printed circuit board 210 in the mobile terminal 200 according to the present disclosure. And a region occupied by the antenna on the circuit board 220 can be reduced by using the characteristic of the bendable flexible printed circuit board 210 to overcome the design limitations.

As illustrated in FIG. 4, the flexible printed circuit board 210 may be coupled and electrically connected to a rigid circuit board 220 using connectors 210a and 220a. A first connector 210a is mounted on the flexible printed circuit board 210, and a second connector 220a is mounted on the rigid circuit board 220.

The first connector 210a and the second connector 220a may be coupled to each other. The first and second connectors 210a and 220a are board-to-board connectors, one of which may be configured as a receptacle connector, and another may be configured as a plug connector.

In addition, a first antenna 211 for transmitting 4G signals and a second antenna 212 having array elements 212a may be configured in different regions, respectively. In this instance, as illustrated in FIG. 4, the second antenna 212 using a 5G frequency band may be disposed to face a side surface of a case 202 adjacent to one side of the circuit board 220. Accordingly, radio signals can be emitted toward the side surface of the case 202 to ensure wider coverage. The side surface of the case 202 may be made of a dielectric material so that radio signals can be emitted through the side surface.

Figure 5:
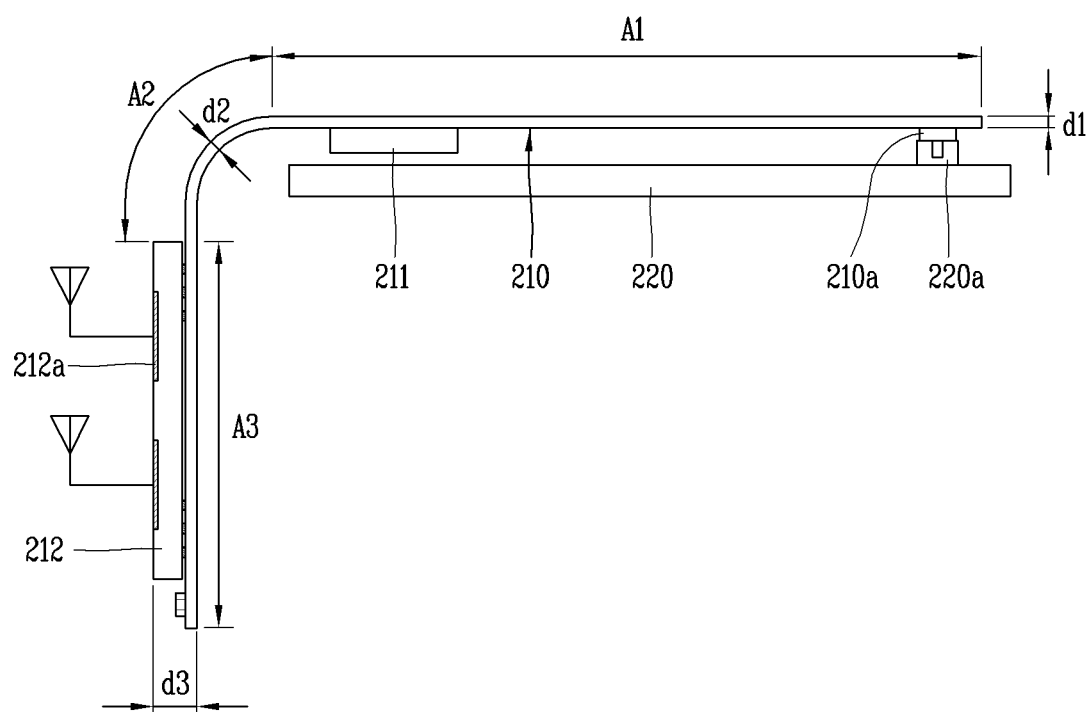
FIG. 5 is a side view illustrating a flexible printed circuit board positioned inside a mobile terminal.
Figure 6:
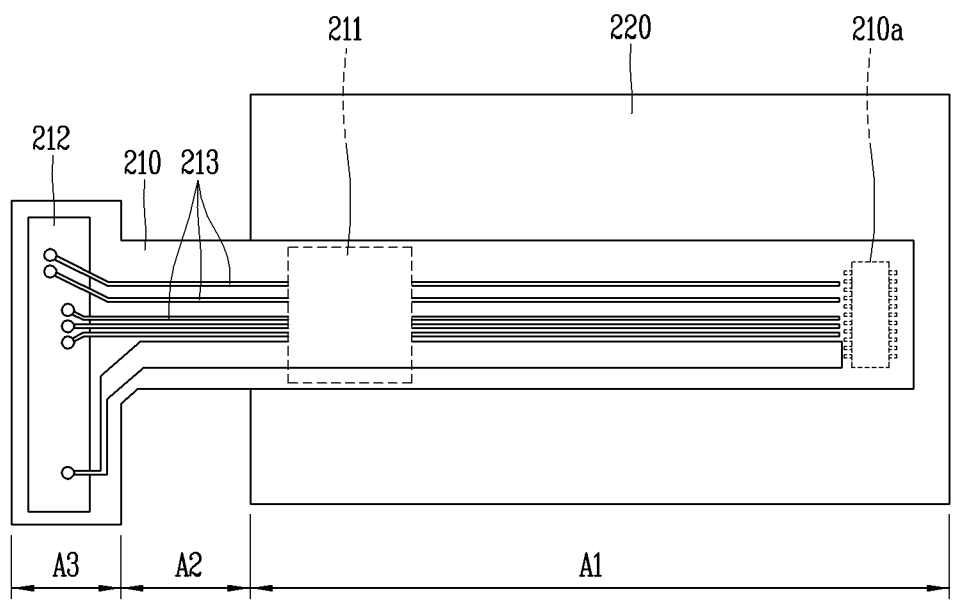
FIG. 6 is a planar view of the flexible printed circuit board in FIG. 5, viewed from a top.
Figure 7:
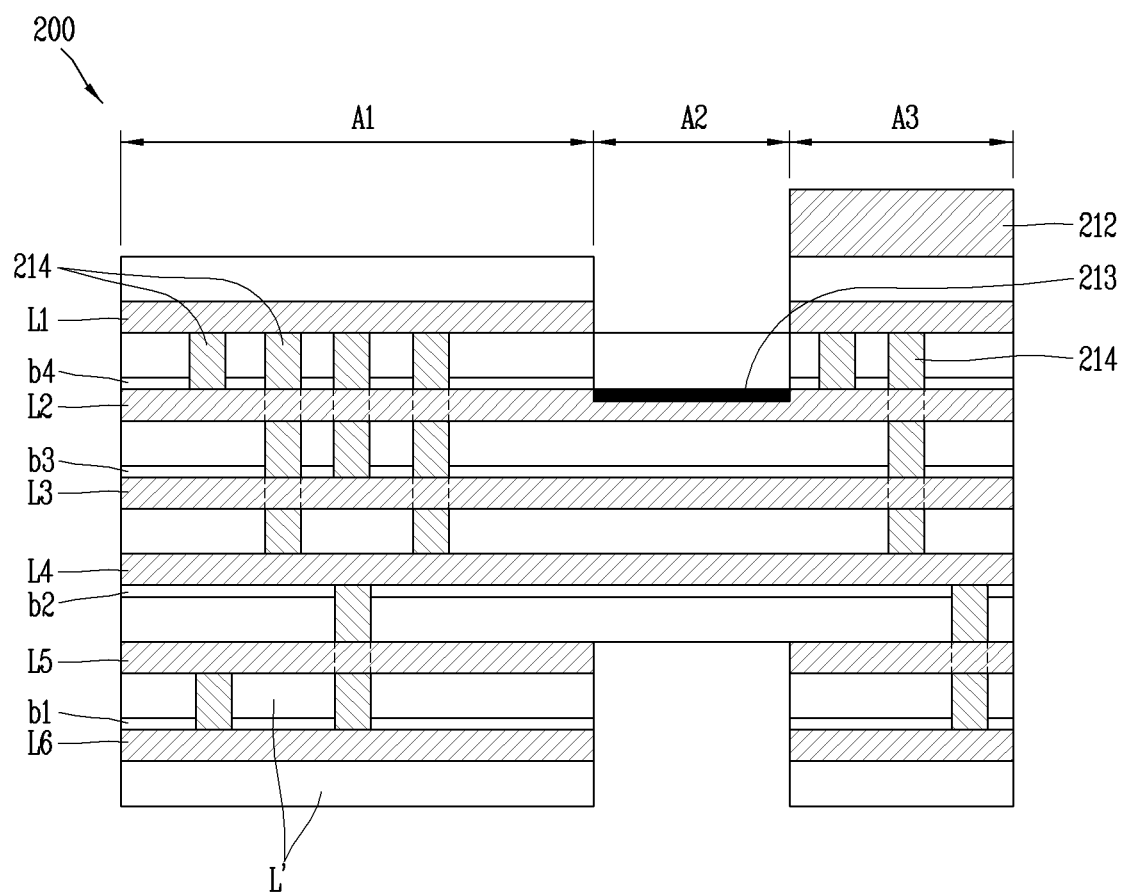
FIG. 7 is a view illustrating an internal structure of a flexible printed circuit board.

FIG. 5 is a side view illustrating the flexible printed circuit board 210 positioned inside the mobile terminal 200. FIG. 6 is a planar view of the flexible printed circuit board 210 in FIG. 5, viewed from a top. FIG. 7 is a view illustrating an internal structure of the flexible printed circuit board 210. As illustrated in FIGS. 4 and 5, the flexible printed circuit board 210 may be bent at one side and positioned inside the mobile terminal 200.

The flexible printed circuit board 210 and the circuit board 220 are electrically connected to each other, include a plurality of layers in which insulating layers and conductive layers are alternately stacked. The conductive layer may be made of a conductive material such as copper, and the insulating layer may be formed of an insulating material such as silicon. Vias 214 may be disposed between the conductive layers provided on the insulating layer for electrical connection.

The flexible printed circuit board 210 may include four to six conductive layers, and insulating layers stacked on the conductive layers in an alternating manner. Hereinafter, a structure having six conductive layers L1 to L6 will be described as an example (see FIG. 7), for convenience of description. However, this is only one example, and the flexible printed circuit board 210 may be configured with various numbers of conductive layers and insulating layers.

For example, the flexible printed circuit board 210 may have six conductive layers L1, L2, L3, L4, L5, and L6, and may have a structure in which insulating layers L' are disposed between adjacent conductive layers L1, L2, L3, L4, L5, and L6, respectively, as illustrated in FIG. 7. In addition, bonding layers b1, b2, b3, and b4 may be interposed between the conductive layers and the insulating layers. Each conductive layer may be provided with a signal line and a ground layer. At this time, any one selected conductive layer (e.g., L6 in FIG. 7) may be configured as a ground layer, and another randomly selected conductive layer (e.g., L4 in FIG. 7) may be configured as a signal layer.

A first antenna 211 and a second antenna 212 may be mounted on the flexible printed circuit board 210 at positions spaced apart from each other. Each antenna generates a radio frequency (RF) signal by using an IF band signal and an LO signal, and emits the RF signal.

As illustrated in FIG. 5, the first antenna 211 may be disposed to face a rear or end surface of the case 202 facing the circuit board 220 by an adhesive 220b so that a beamformed radio signal is emitted through the rear surface of the case 202. For example, as shown in FIGS. 4 and 5, the first antenna 211 is sandwiched between the flexible printed circuit board 210 and the circuit board 220 to face a top or bottom end of the case 202 that is substantially perpendicular to the side surfaces of the case 202. That is, the second antenna 212 may be disposed to face the side side surface of the case 202 adjacent to one side of the circuit board so that the beamformed radio signal is emitted through the side surface of the case 202. Thus, the beamformed radio signals are substantially perpendicular to each other.

The flexible printed circuit board 210 may be divided into a first region A1 where the first antenna 211 is located, a second region A2 that is bent at a side portion of the first region A1 and is provided with microstrip lines 213 on any one conductive layer to transmit signals, and a third region A3 that is located at one side portion of the second region A2 and in which the second antenna 212 is stacked. Here, the first, second, and third regions A1, A2, and A3 mean regions arbitrarily partitioned for convenience of description.

The first antenna 211 is installed in the first region A1 to emit radio signals to the rear surface of the case 202. The first connector 210a may be installed on one side of the first region A1 to be connected to the second connector 220a mounted on the circuit board. In detail, the first connector 210a may be mounted on a lower surface of the first region A1, and the second connector 220a inserted into the first connector 210a may be mounted on the circuit board.

In addition, a wireless communication module configured to process radio signals may be mounted on any one side of the first region A1. For example, an RFIC module may be disposed on the front and/or rear surface of the first region A1. In addition, the first antenna 211 configured to transmit and receive radio signals may be mounted in the first region A1, so that the mobile terminal can perform communication.

As illustrated in FIG. 7, since the first region A1 has a structure in which a plurality of conductive layers and insulating layers are alternately stacked, the first region A1 may have a rigid characteristic, and vias 214 that connect the conductive layers provided in the first region A1 may be installed. The via 214 has a current-carrying structure in which a hole is formed in an insulating layer and a conductive material is applied to a wall of the hole or is filled in the hole.

The second region A2 refers to a part configured to be bent with a predetermined curvature so as to correspond to an inner surface of the case 202, and is located between the first region A1 and the third region A3. The second region A2 is a section in which the flexible printed circuit board 210 is bent between the first antenna 211 and the second antenna 212. Since the second region A2 is bent along the inner surface of the case 202, the structure of the via connecting the conductive layers may not be maintained. If the structure of the via is not maintained, a ground resonance effect may occur in a 5G terminal using a high frequency band, namely, mmWave frequency and affect the emission of the radio signal.

Accordingly, the flexible printed circuit board 210 located inside the mobile terminal 200 according to the present disclosure may be configured to have microstrip lines at the bent portion (second region A2) to prevent the ground resonance effect reducing strength of the radio signal from occurring at the bent portion in the mmWave frequency band.

As illustrated in FIG. 5, the second region A2 is configured such that a conductive layer constituting the signal layer is disposed on another conductive layer constituting the ground layer, and the microstrip lines 213 pass through the second region A2. The microstrip lines 213 are provided in any one conductive layer positioned inside the flexible printed circuit board 210 in the second region A2 to transmit signals.

In addition, the microstrip lines 213 are disposed in the second region A2 to electrically connect the second antenna 212 and the connector. The microstrip lines 213 may be provided with a line for transmitting an IF (Intermediate Frequency) band signal and an LO (Local Oscillator) signal, a line for transmitting a control signal, and a line for transmitting power.

The second antenna 212 formed of a copper clad laminate may be stacked in the third region A3. Since the second region A2 has a structure that is bent in a shape corresponding to a side surface portion of the case 202, the third region A3 is positioned to face the side surface portion of the case 202. Accordingly, the second antenna 212 stacked on an upper surface of the third region A3 may emit radio signals in a direction crossing the first antenna 211. That is, the radio signals from the first and second antennas 211 and 212 are substantially perpendicular to each other. With this configuration, an integrated circuit and the second antenna 212 may not be arranged in a stacked manner and thus a structure may be lowered in height, which results in implementing a slim mobile terminal 200.

In the third region A3, a copper clad laminate may be stacked on the flexible printed circuit board 210. Copper clad laminates are laminates used in printed circuits, and refer to copper layers formed on one or both surfaces of a laminated insulation plate formed of various insulating materials and binders. As illustrated in FIG. 7, the copper clad laminate is formed on the L1 layer of the flexible printed circuit board 210. The copper clad laminate may be processed to form an antenna pattern, thereby being implemented as the second antenna 212.

In the third region A3, when the second antenna 212 is configured in a manner that the copper clad laminate 212 is stacked on the flexible printed circuit board 210 and the antenna pattern is implemented on the copper clad laminate 212, a minimum height for implementing a performance of the antenna can be secured. Preferably, the third region A3 may have a height of at least 0.7 mm by stacking the copper clad laminate 212. Accordingly, a thickness d3 of the third region A3 may have a larger value than a thickness d1 of the first region A1 and a thickness d2 of the second region A2.

Figure 8:
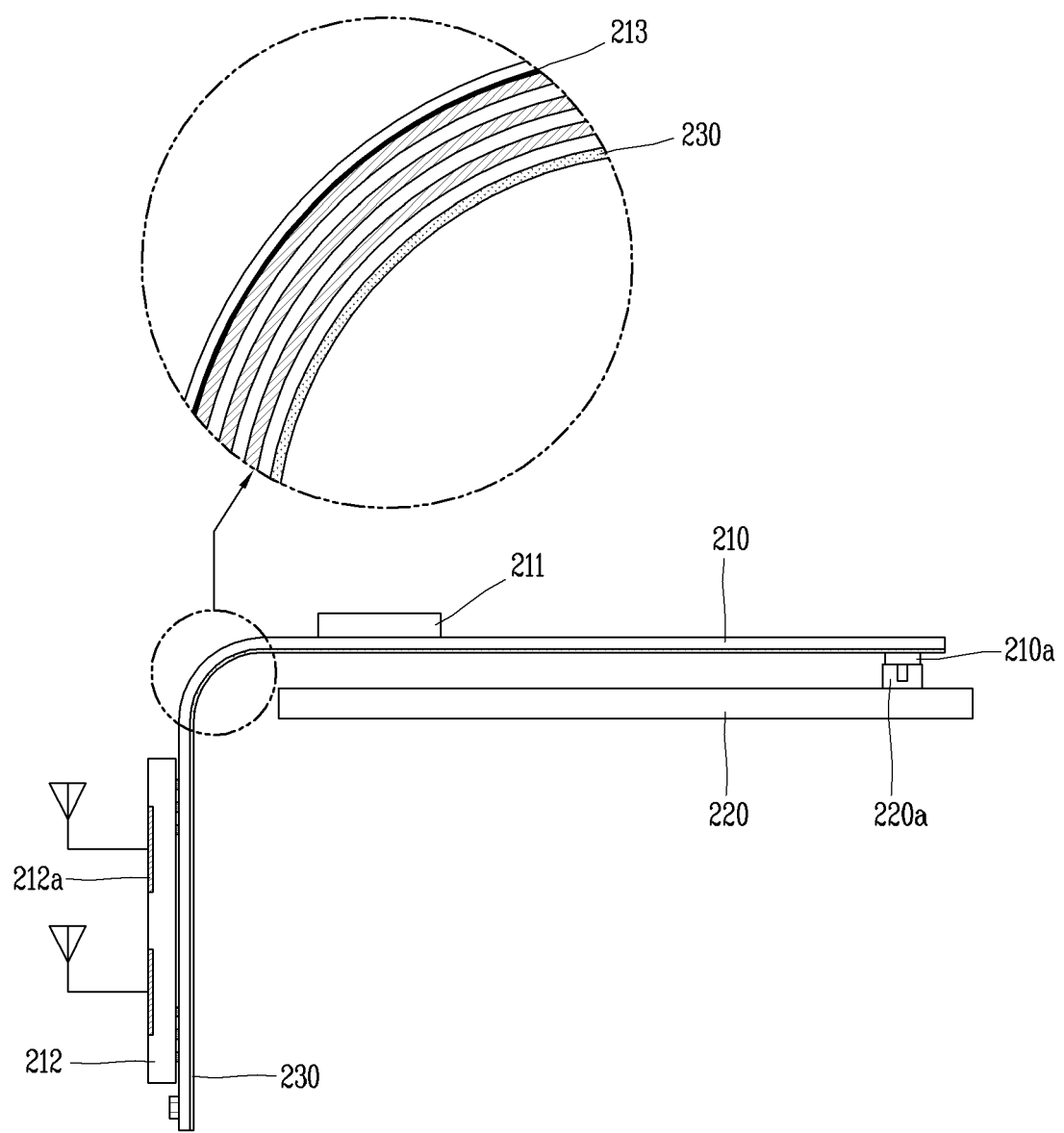
FIG. 8 is a conceptual view illustrating another embodiment of the present disclosure, illustrating an appearance of the flexible printed circuit board.

FIG. 8 is a conceptual view illustrating another embodiment of the present disclosure, illustrating an appearance of the flexible printed circuit board. A ground layer may be formed on a lower end surface of the flexible printed circuit board 210 of the mobile terminal 200 according to this embodiment, and a shielding sheet 230 may be disposed on a lower surface of the ground layer to cover the ground layer.

The shielding sheet 230 serves to shield an EMI, and serves to reduce an occurrence of emission loss by the microstrip lines 213 formed in the bent portion of the second region A2. The shielding sheet 230 may be formed on the entire lower surface of the flexible printed circuit board 210, or may be configured to cover only a lower end portion of the second region A2 in which the microstrip lines 213 are disposed.

As another embodiment, a ground layer may be formed on a lower end portion of the flexible printed circuit board 210, and a cover layer (not illustrated) may be disposed on a lower surface of the ground layer to prevent oxidation. The cover layer may be made of an insulating material and coated on the ground layer.

The cover layer (not illustrated) may also be formed on the entire lower surface of the flexible printed circuit board 210, or may be configured to cover only the lower end portion of the second region A2 in which the microstrip lines 213 are disposed. The detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

The present disclosure may be variously implemented and applied in an industrial field for producing and using mobile terminals.

The invention claimed is:

1. A mobile terminal comprising:
a case;
a circuit board disposed inside the case;
a flexible printed circuit board electrically connected to the circuit board, and having insulating layers and conductive layers stacked in an alternating manner;
a first antenna disposed on a first region of the flexible printed circuit board and facing an end surface of the case and configured to transmit radio signals in a direction toward the end surface of the case;
a plurality of microstrip lines disposed on a bent second region of the flexible printed circuit board at a side portion of the first region; and
a copper clad laminate stacked second antenna disposed on a third region of the flexible printed circuit board positioned on another side portion of the second region and configured to transmit radio signals in a direction toward a side surface of the case;
wherein the flexible printed circuit board includes a plurality of through holes in the first region and the third region, and
wherein the microstrip lines are disposed on an outermost conductive layer of the flexible printed circuit board.

2. The mobile terminal of claim 1, wherein the second antenna comprises an array antenna disposed on an outer surface of the third region.

3. The mobile terminal of claim 1, wherein the second region includes a conductive signal layer on a conductive ground layer.

4. The mobile terminal of claim 1, further comprising:
a connector installed on one side of the first region to be connected to the circuit board.

5. The mobile terminal of claim 4, wherein the connector includes a first connector mounted on a lower surface of the first region, and a second connector inserted into the first connector and mounted on the circuit board.

6. The mobile terminal of claim 1, further comprising:
a ground layer on a lower end surface of the flexible printed circuit board; and
a shielding sheet coupled to a lower surface of the ground layer.

7. The mobile terminal of claim 1, further comprising:
a ground layer on a lower end surface of the flexible printed circuit board; and
a cover layer on a lower surface of the ground layer to prevent oxidation.

8. The mobile terminal of claim 7, wherein the cover layer covers a lower end portion of the second region.

9. The mobile terminal of claim 1, wherein the radio signals transmitted by the first antenna are substantially perpendicular to the radio signals transmitted by the second antenna.

10. The mobile terminal of claim 1, further comprising:
a wireless communication module configured to process the radio signals and being mounted on any one side of the first region.

11. The mobile terminal of claim 1, wherein the end surface of the case is a top end surface or a bottom end surface such that the end surface and the side surface of the case are substantially perpendicular to each other.

12. A flexible printed circuit board located inside a mobile terminal, the flexible printed circuit board comprising:
a plurality of insulating layer and conductive layers stacked in an alternating manner;
a first region including a first antenna disposed thereon, the first antenna facing an end surface of the mobile terminal and configured to transmit radio signals in a direction toward the end surface of the mobile terminal;
a bent second region at a side portion of the first region, and including a plurality of microstrip lines; and
a third region positioned on an opposite side of the first region with respect to the second region, and having a copper clad laminate stacked second antenna to transmit radio signals in a direction toward a side surface of the mobile terminal,
wherein the flexible printed circuit board includes a plurality of through holes in the first region and the third region, and
wherein the microstrip lines are disposed on an outermost conductive layer of the flexible printed circuit board.

13. The flexible printed circuit board of claim 12, wherein the second antenna comprises an array antenna on an outer surface of the third region.

14. The flexible printed circuit board of claim 12, further comprising:
a ground layer formed on a lower end surface of the flexible printed circuit board; and
a shielding sheet coupled to a lower surface of the ground layer.

15. The flexible printed circuit board of claim 12, further comprising:
a ground layer formed on a lower end surface of the flexible printed circuit board; and
a cover layer formed on a lower surface of the ground layer to prevent oxidation.

16. The flexible printed circuit board of claim 12, wherein the end surface of the mobile terminal is a top end surface or a bottom end surface such that the end surface and the side surface of the mobile terminal are substantially perpendicular to each other.

17. The flexible printed circuit board of claim 12, further comprising:
a wireless communication module configured to process the radio signals and being mounted on any one side of the first region.

* * * * *